United States Patent
Kida et al.

(10) Patent No.: US 12,324,177 B2
(45) Date of Patent: Jun. 3, 2025

(54) SEMICONDUCTOR DEVICE AND METHOD FOR MANUFACTURING THE SAME

(71) Applicant: DENSO CORPORATION, Kariya (JP)

(72) Inventors: Hirofumi Kida, Toyota (JP); Hidemoto Tomita, Toyota (JP); Tomohiko Mori, Nagakute (JP); Hideya Yamadera, Nagakute (JP)

(73) Assignee: DENSO CORPORATION, Kariya (JP)

( * ) Notice: Subject to any disclaimer, the term of this patent is extended or adjusted under 35 U.S.C. 154(b) by 483 days.

(21) Appl. No.: 17/722,519

(22) Filed: Apr. 18, 2022

(65) Prior Publication Data

US 2022/0238703 A1 Jul. 28, 2022

Related U.S. Application Data

(63) Continuation of application No. PCT/JP2019/041752, filed on Oct. 24, 2019.

(51) Int. Cl.
*H10D 30/83* (2025.01)
*H10D 30/01* (2025.01)
*H10D 62/85* (2025.01)

(52) U.S. Cl.
CPC .......... *H10D 30/051* (2025.01); *H10D 30/83* (2025.01); *H10D 62/8503* (2025.01)

(58) Field of Classification Search
None
See application file for complete search history.

(56) References Cited

U.S. PATENT DOCUMENTS

| | | |
|---|---|---|
| 2017/0229573 A1 | 8/2017 | Kinoshita et al. |
| 2018/0204838 A1* | 7/2018 | Hsu ................... H01L 21/76224 |
| 2020/0052104 A1* | 2/2020 | Tomita ................ H01L 21/0274 |

OTHER PUBLICATIONS

Ueno, "Development of Normally-off type MOSFET on Homo-Epitaxial GaN Layer", Applied Physics 2017, 86(5): pp. 376-380 (and partial English translation).

* cited by examiner

*Primary Examiner* — Xiaoming Liu
(74) *Attorney, Agent, or Firm* — Posz Law Group, PLC

(57) ABSTRACT

A semiconductor device includes a nitride semiconductor layer, a source electrode, a drain electrode, and an insulating gate portion. The nitride semiconductor layer has an element part and a peripheral withstand voltage part. The source electrode is disposed adjacent to a first main surface of the nitride semiconductor layer. The drain electrode is disposed adjacent to a second main surface of the nitride semiconductor layer. The nitride semiconductor layer is formed with a first groove on the first main surface in the element part, and a second groove on the first main surface in the peripheral withstand voltage part. A JFET region is embedded in the first groove in the element part. An inclination angle of a side surface of the first groove adjacent to a channel portion of a body region is smaller than an inclination angle of a side surface of the second groove.

3 Claims, 10 Drawing Sheets

SEMICONDUCTOR DEVICE AND METHOD FOR MANUFACTURING THE SAME

CROSS REFERENCE TO RELATED APPLICATION

The present application is a continuation application of International Patent Application No. PCT/JP2019/041752 filed on Oct. 24, 2019, which designated the U.S. The entire disclosures of the above application are incorporated herein by reference.

TECHNICAL FIELD

The present disclosure relates to a semiconductor device and a method for manufacturing the semiconductor device.

BACKGROUND

For example, it is known a vertical semiconductor device that includes a nitride semiconductor layer, a source electrode disposed on a main surface of the nitride semiconductor layer, and a drain electrode disposed on the other main surface of the nitride semiconductor layer. The nitride semiconductor layer has an n-type drift region, an n-type JFET region disposed on the drift region, and a p-type body region disposed on the drift region and adjacent to the JFET region.

In such a vertical semiconductor device, a groove is generally formed in a peripheral withstand voltage part of a nitride semiconductor layer. In a case where such a groove is provided, it is possible to relax the electric field concentration in the vicinity of a p-n junction surface of the n-type drift region and the p-type body region on a peripheral edge of an element part.

SUMMARY

The present disclosure describes a semiconductor device and a method for manufacturing a semiconductor device. According to an aspect of the present disclosure, a semiconductor device includes a nitride semiconductor layer, a source electrode, a drain electrode, and an insulating gate portion. The nitride semiconductor layer has an element part and a peripheral withstand voltage part disposed on a periphery of the element part. The source electrode is disposed adjacent to a first main surface of the nitride semiconductor layer. The drain electrode is disposed adjacent to a second main surface of the nitride semiconductor layer. The nitride semiconductor layer is formed with a first groove on the first main surface in the element part, and a second groove on the first main surface in the peripheral withstand voltage part. A JFET region is embedded in the first groove in the element part. An inclination angle of a side surface of the first groove adjacent to a channel portion of a body region is smaller than an inclination angle of a side surface of the second groove.

BRIEF DESCRIPTION OF DRAWINGS

Features and advantages of the present disclosure will become more apparent from the following detailed description made with reference to the accompanying drawings, in which.

DETAILED DESCRIPTION

Figure 1:
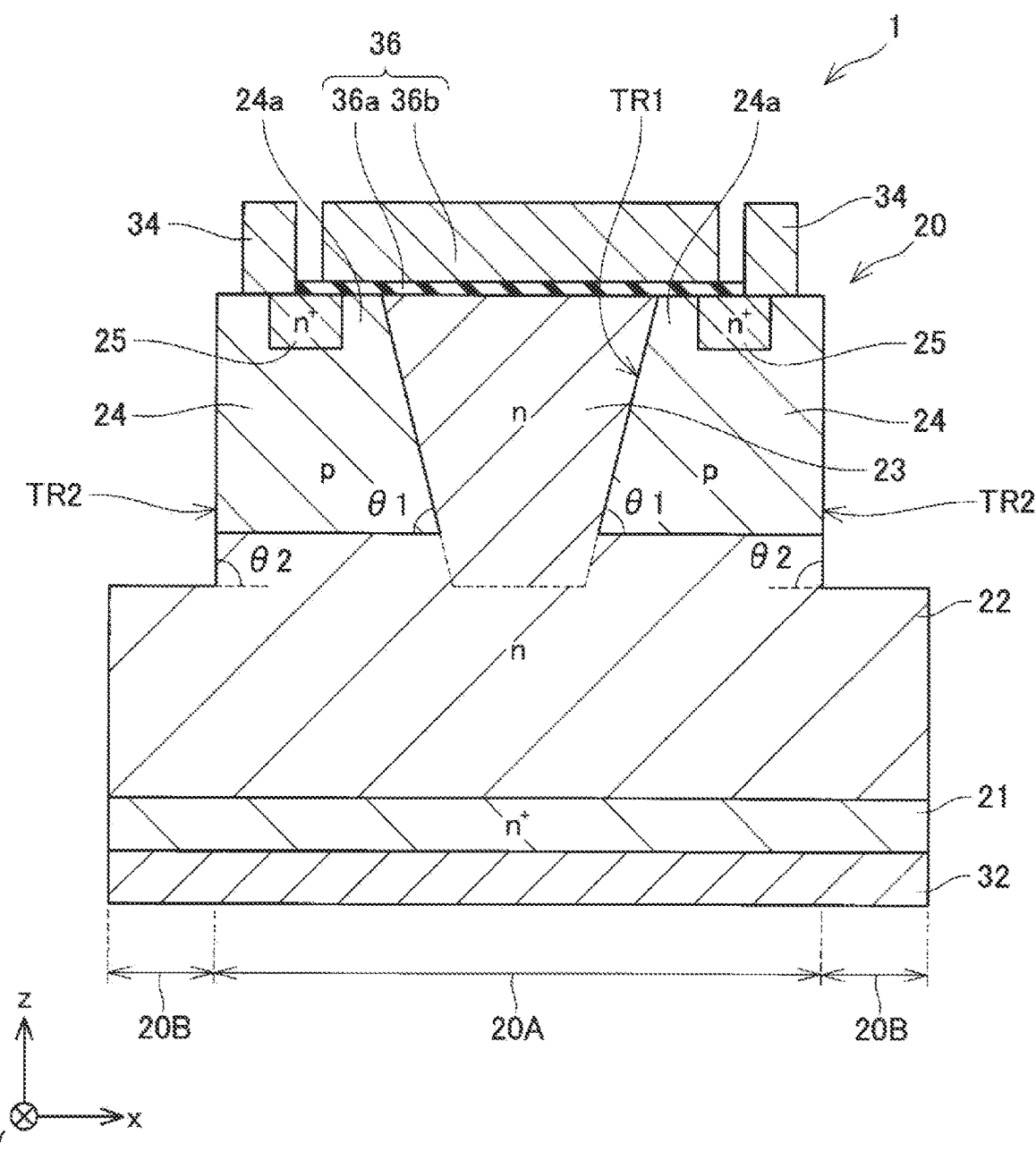
FIG. 1 is a diagram schematically showing a cross-sectional view of a main part of a semiconductor device according to an embodiment.

To begin with, a relevant technology will be described only for understanding embodiments of the present disclosure.

For example, there is a vertical semiconductor device that includes a nitride semiconductor layer, a source electrode disposed on a main surface of the nitride semiconductor layer, and a drain electrode disposed on the other main surface of the nitride semiconductor layer. The nitride semiconductor layer has an n-type drift region, an n-type JFET region disposed on the drift region, and a p-type body region disposed on the drift region and adjacent to the JFET region. A groove is generally formed in a peripheral withstand voltage part of a nitride semiconductor layer to relax the electric field concentration in the vicinity of a p-n junction surface of the n-type drift region and the p-type body region on a peripheral edge of an element part.

In manufacturing such a type of vertical semiconductor device, the p-type body region is epitaxially grown on the n-type drift region, and then a part of the body region is dry-etched. Further, the n-type JFET region is then formed by performing an epitaxial growth again. The reason why such a manufacturing method is adopted is that it is difficult to activate p-type impurities, which are introduced by using an ion implantation technique, when the p-type region is formed in the nitride semiconductor layer. Therefore, in such a type of semiconductor device, there is a need for a technique capable of satisfactorily embedding the JFET region in the groove that is formed by dry etching the part of the body region.

Further, in such a type of semiconductor device, there is another need for a technique for further relaxing the electric field concentration near the p-n junction surface between the n-type drift region and the p-type body region on the peripheral edge of the element part to further improve the breakdown voltage.

The present disclosure provides a technique for achieving both improvement of an embedding property of a JFET region and improvement of a breakdown voltage.

According to an aspect of the present disclosure, a semiconductor device includes a nitride semiconductor layer, a source electrode, a drain electrode, and an insulating gate portion. The nitride semiconductor layer is sectioned into an element part and a peripheral withstand voltage part disposed on a periphery of the element part. The source electrode is disposed adjacent to a first main surface of the nitride semiconductor layer. The drain electrode is disposed adjacent to a second main surface of the nitride semiconductor layer. The nitride semiconductor layer includes a first conductivity type drift region, a first conductivity type JFET region, a second conductivity type body region, and a first conductivity type source region. The drift region is provided in the element part and the peripheral withstand voltage part. The JFET region is provided in the element part. The JFET region is located on the drift region, and is embedded in a first groove provided on the first main surface of the nitride semiconductor layer. The body region is provided in the element part. The body region is located on the drift region, and is adjacent to the JFET region. The source region is provided in the element part. The source region is separated from the JFET region by the body region. The insulating gate portion is provided in the element part. The insulating gate portion faces a channel portion of the body region that separates the JFET region and the source region. A second groove is provided on the first main surface of the nitride semiconductor layer in the peripheral withstand voltage part. An inclination angle of a side surface of the first groove adjacent to the channel portion is smaller than an inclination angle of a side surface of the second groove.

In the semiconductor device described above, the inclination angle of the side surface of the first groove in which the JFET region is embedded is formed to be small. For example, the JFET region is formed in a tapered shape that narrows in the depth direction of the nitride semiconductor layer. Therefore, when the JFET region is formed in the first groove by performing an epitaxial growth again, the JFET region can be satisfactorily embedded in the first groove without forming a cavity or the like. On the other hand, the inclination angle of the side surface of the second groove is formed to be large. When the inclination angle of the side surface of the second groove is large, the electric field concentration in the vicinity of the p-n junction surface between the drift region and the body region is relaxed at the peripheral edge of the element part, and thus the breakdown voltage is improved. In the semiconductor device described above, both the improvement of the embedding property of the JFET region and the improvement of the breakdown voltage are achieved.

According to an aspect of the present disclosure, a method for manufacturing a semiconductor device includes: preparing a nitride semiconductor layer having a first conductivity type drift region and a second conductivity type body region which is disposed on the drift region and exposed on a first main surface of the nitride semiconductor layer; forming a first groove and a second groove in the nitride semiconductor layer at a same time by a dry etching technique, in which the first groove and the second groove extends from the first main surface of the nitride semiconductor layer to the drift region through the body region, the first groove is formed in a portion of an element part of the nitride semiconductor layer and the second groove is formed in a peripheral withstand voltage part of the nitride semiconductor layer; forming a first conductivity type JFET region so as to be embedded in the first groove; forming a first conductivity type source region so as to be separated from the JFET region by the body region; and forming an insulating gate portion so as to face a channel portion of the body region that separates the JFET region and the source region. The forming of the first groove and the second groove at the same time includes either: (i) forming the first groove and the second groove so that a contour of a side surface of the first groove adjacent to the channel region and exposed on the first main surface is parallel to an m-plane and a contour of a side surface of the second groove exposed on the first main surface is parallel to an a-plane; or (ii) forming the first groove and the second groove so that the contour of the side surface of the first groove adjacent to the channel region and exposed on the first main surface is parallel to the a-plane and the contour of the side surface of the second groove exposed on the first main surface is parallel to the m-plane.

In such a method, the first groove for embedding the JFET region therein and the second groove of the peripheral withstand voltage part are simultaneously formed. Further, the plane orientation of the crystal plane adopted for forming the first groove and the plane orientation of the crystal plane adopted for forming the second groove are different from each other. As a result, even if the first groove and the second groove are formed at the same time, the inclination angle of the side surface of the first groove and the inclination angle of the side surface of the second groove can be made different from each other. Accordingly, the inclination angle of the side surface of the first groove and the inclination angle of the side surface of the second groove can be adjusted according to the characteristics required for the semiconductor device, while reducing the number of steps.

Hereinafter, a semiconductor device and a method for manufacturing the semiconductor device to which the technique disclosed in the present disclosure is applied will be described with reference to the drawings. It should be noted that, in embodiments shown below, basic configurations of the semiconductor device are simplified in order to help understanding the technique disclosed in the present disclosure, and may be different from those of an actual semiconductor device.

FIG. 1 shows a cross-sectional view of a main part of a semiconductor device 1 according to an embodiment of the present disclosure. The semiconductor device 1 includes a nitride semiconductor layer 20, a drain electrode 32, a source electrode 34, and an insulating gate portion 36. The nitride semiconductor layer 20 is sectioned into an element part 20A and a peripheral withstand voltage part 20B. The drain electrode 32 is disposed so as to cover a back surface of the nitride semiconductor layer 20. The source electrode 34 is disposed so as to cover a front surface of the nitride semiconductor layer 20. The insulating gate portion 36 is disposed on a part of the front surface of the nitride semiconductor layer 20. The front surface of the nitride semiconductor layer 20 will also be referred to as a first main surface of the nitride semiconductor layer 20. The back surface of the nitride semiconductor layer 20 will also be referred to as a second main surface of the nitride semiconductor layer 20. The peripheral withstand voltage part 20B is provided around the element part 20A. The peripheral withstand voltage part 20B is arranged so as to entirely surround a periphery of the element part 20A when the nitride semiconductor layer 20 is viewed in a plan view, that is, viewed along a Z direction. The nitride semiconductor layer 20 has an $n^+$-type drain region 21, an n-type drift region 22, an n-type JFET region 23, a p-type body region 24, and an $n^+$-type source region 25.

The drain region 21 is provided in both the element part 20A and the peripheral withstand voltage part 20B. The drain region 21 is arranged at a position exposed on the back surface of the nitride semiconductor layer 20, and is in ohmic contact with the drain electrode 32. The drain region 21 is provided by gallium nitride (GaN) containing an n-type impurity. As will be described later, the drain region 21 is a base substrate for epitaxially growing the drift region 22 and the body region 24. The drain region 21 is a GaN substrate having a c-plane as a front surface.

The drift region 22 is provided in both the element part 20A and the peripheral withstand voltage part 20B. The drift region 22 is arranged on the surface of the drain region 21, and is located between the drain region 21 and the JFET region 23, and between the drain region 21 and the body region 24. The drift region 22 is provided by gallium nitride (GaN) containing an n type impurity.

The JFET region 23 is provided in the element part 20A. The JFET region 23 is arranged on the surface of the drift region 22, and is in a form protruding from the surface of the drift region 22. The JFET region 23 is embedded in a first groove TR1 formed on the front surface of the nitride semiconductor layer 20. The JFET region 23 is in a tapered shape that narrows from the front surface of the nitride semiconductor layer 20 toward the drift region 22, that is, in a thickness direction or in a depth direction. The JFET region 23 is provided by gallium nitride (GaN) containing an n-type impurity. As an example, the JFET region 23 has an impurity concentration equal to an impurity concentration of the drift region 22.

The body region 24 is provided in the element part 20A. The body region 24 is arranged on the surface of the drift region 22, and is adjacent to the JFET region 23. The body region 24 is arranged at a position exposed on the front surface of the nitride semiconductor layer 20 and is in ohmic contact with the source electrode 34. The body region 24 is provided by gallium nitride (GaN) containing a p-type impurity.

The source region 25 is provided in the element part 20A. The source region 25 is arranged on the surface of the body region 24, and is separated from the JFET region 23 by the body region 24. The source region 25 is arranged at a position exposed on the front surface of the nitride semiconductor layer 20 and is in ohmic contact with the source electrode 34. The source region 25 is provided by gallium nitride (GaN) containing an n type impurity.

The insulating gate portion 36 is provided in the element part 20A. The insulating gate portion 36 is arranged at a part on the front surface of the nitride semiconductor layer 20. The insulating gate portion 36 includes a gate insulating film 36a made of silicon oxide and a gate electrode 36b made of polysilicon. The gate electrode 36b faces a channel portion 24a of the body region 24, which separates the JFET region 23 and the source region 25, and the JFET region 23 via the gate insulating film 36a.

The peripheral withstand voltage part 20B of the nitride semiconductor layer 20 is formed with a second groove TR2 on the front surface of the nitride semiconductor layer 20. The second groove TR2 has a depth that passes through the body region 24 from the front surface of the nitride semiconductor layer 20 and reaches the drift region 22. Therefore, a p-n junction surface between the drift region 22 and the body region 24 is exposed on the side surface of the second groove TR2. As a result, the electric field concentration in the vicinity of the p-n junction surface of the drift region 22 and the body region 24 is relaxed at a peripheral edge of the element part 20A.

Figure 2:
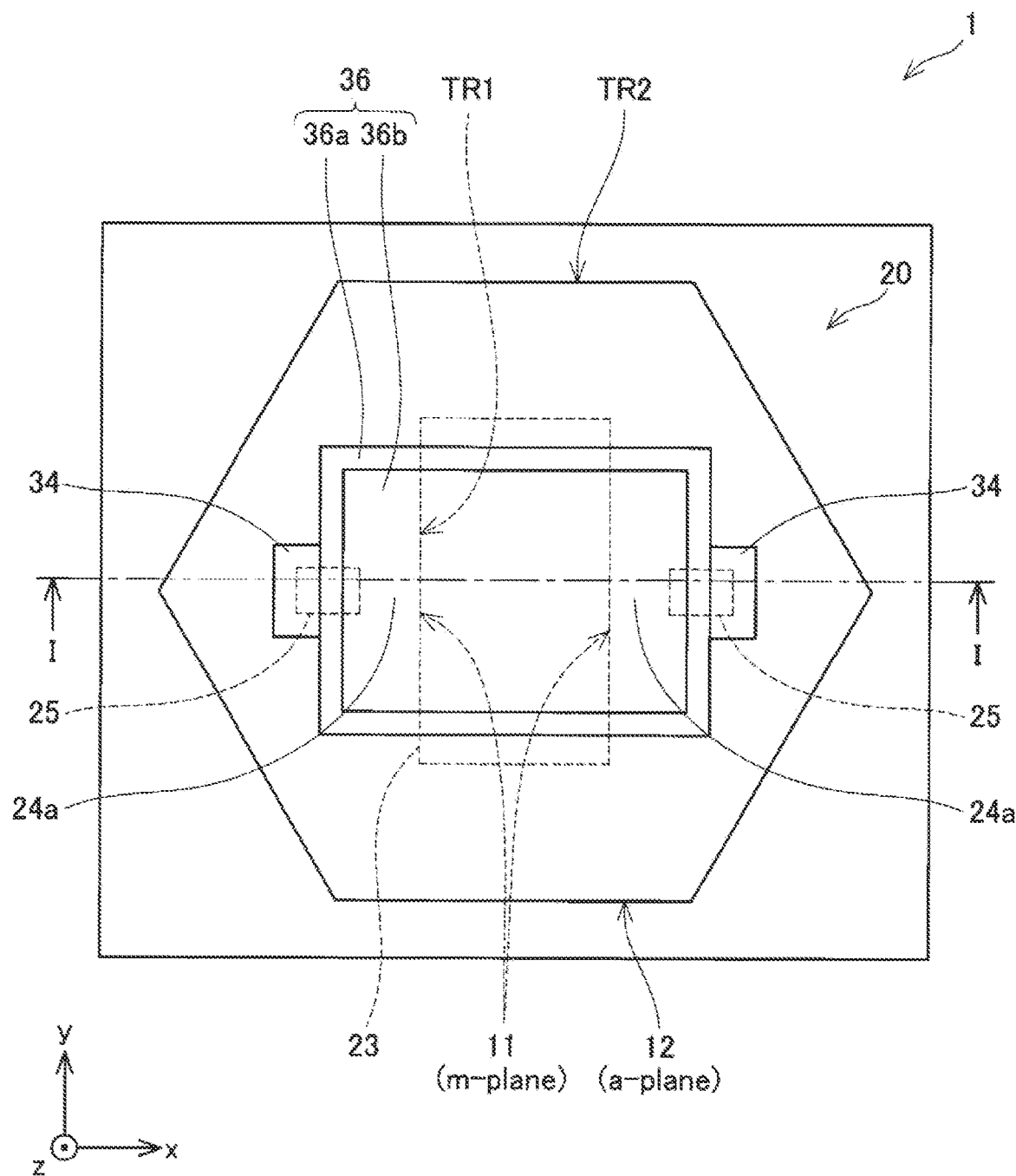
FIG. 2 is a diagram schematically showing a plan view of the main part of the semiconductor device according to the embodiment.

FIG. 2 schematically shows a plan view of a main part of the semiconductor device 1. The cross-sectional view of the main part of the semiconductor device shown in FIG. 1 corresponds to a cross-sectional view taken along a line I-I in FIG. 2. As shown in FIG. 2, the JFET region 23 has an elongated shape extending in a Y direction when the nitride semiconductor layer 20 is viewed in the plan view. For example, in an actual semiconductor device, a plurality of JFET regions 23 each extending in the Y direction are arranged in a stripe shape in the element part 20A. The source region 25 is arranged apart from the JFET region 23 in an X direction. The channel portion 24a of the body region 24 is located between the source region 25 and the JFET region 23.

As described above, the JFET region 23 has the elongated shape extending in the Y direction when the nitride semiconductor layer 20 is viewed in the plan view. Therefore, the first groove TR1 in which the JFET region 23 is embedded has a side surface (also referred to as a lengthwise surface) extending in the Y direction when the nitride semiconductor layer 20 is viewed in the plan view. The side surface of the first groove TR1 is adjacent to the channel portion 24a. In the semiconductor device 1, the first groove TR1 is formed so that a contour 11 of the first groove TR1 exposed on the front surface of the nitride semiconductor layer 20 and adjacent to the channel portion 24a is parallel to a m-plane. Further, the second groove TR2 is formed in the peripheral withstand voltage part 20B so that a contour 12 of the side surface of the second groove TR2 exposed on the front surface of the nitride semiconductor layer 20 is parallel to an a-plane. Therefore, the contour 12 of the second groove TR2 has a hexagonal shape when the nitride semiconductor layer 20 is viewed in the plan view. In the semiconductor device 1, as described above, the side surface of the first groove TR1 adjacent to the channel portion 24a and the side surface of the second groove TR2 have different surface orientations of crystal planes.

Next, an operation of the semiconductor device 1 will be described. When the semiconductor device 1 is used, the drain electrode 32 is applied with a positive voltage, and the source electrode 34 is grounded. When a positive voltage higher than a gate threshold voltage is applied to the gate electrode 36b, an inversion layer is formed in the channel portion 24a of the body region 24, which separates the JFET region 23 and the source region 25. As a result, the semiconductor device 1 is turned on. At this time, electrons flow from the source region 25 to the JFET region 23 via the inversion layer. The electrons, which have entered the JFET region 23, flow vertically through the JFET region 23 and head toward the drain electrode 32. As a result, the drain electrode 32 and the source electrodes 34 are conducted. When the gate electrode 36b is grounded, the inversion layer disappears. As a result, the semiconductor device 1 is turned off.

In the semiconductor device 1, as shown in FIG. 1, of the side surfaces of the first groove TR1 in which the JFET region 23 is embedded, the side surface adjacent to the channel portion 24a has a first inclination angle $\theta1$. Also, the second groove TR2 formed in the peripheral withstand voltage part 20B has a second inclination angle $\theta2$. In this case, the first inclination angle $\theta1$ and the second inclination angle $\theta2$ satisfy a relation of $\theta1<\theta2$. For example, the first inclination angle $\theta1$ and the second inclination angle $\theta2$ are defined relative to an XY plane including the X direction and the Y direction, such as the surface of the drift region 22. The first inclination angle $\theta1$ of the side surface of the first groove TR1 is in the range of 70° to 80°. The second inclination angle θ2 of the side surface of the second groove TR2 is in the range of 85° to 90°, and is approximately 90°.

In the semiconductor device 1, the first inclination angle θ1 of the side surface of the first groove TR1 adjacent to the channel portion 24a is small. That is, the JFET region 23 is formed in a tapered shape narrowing in the depth direction of the nitride semiconductor layer 20. Therefore, as will be described later, when the JFET region 23 is formed in the first groove TR1 by performing an epitaxial growth again, the JFET region 23 is satisfactorily embedded in the first groove TR1 without forming a cavity or the like.

On the other hand, the second inclination angle θ2 of the side surface of the second groove TR2 is large. When the second inclination angle θ2 of the side surface of the second groove T2 is large, the electric field concentration near the p-n junction surface between the drift region 22 and the body region 24 is relaxed at the peripheral edge of the element part 20A. Thus, the breakdown voltage is improved. In the semiconductor device 1, as described above, the improvement of the embedding property of the JFET region 23 and the improvement of the breakdown voltage can be both achieved.

(Method for Manufacturing Semiconductor Device)

Figure 3:
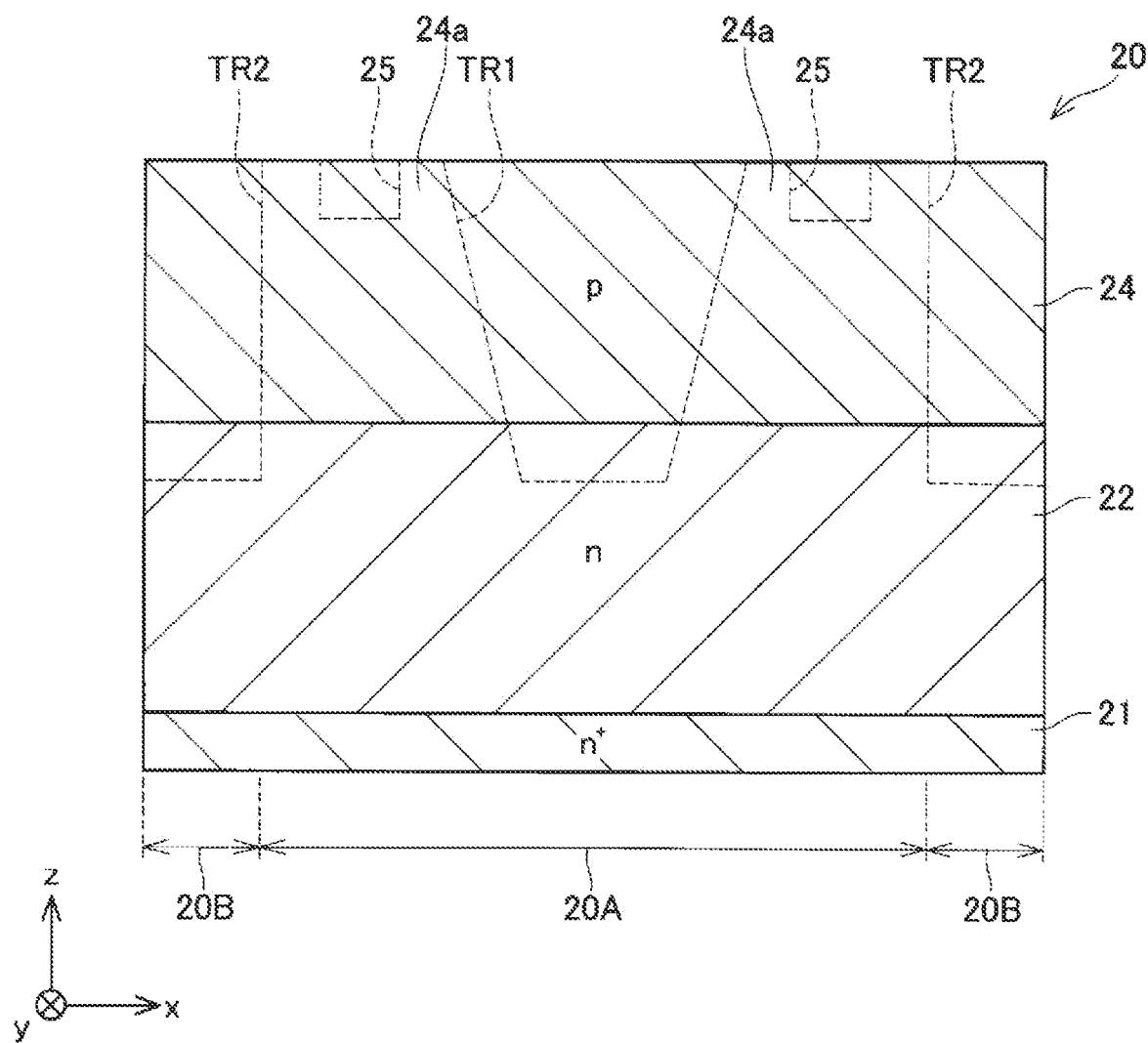
FIG. 3 is a diagram schematically showing a cross-sectional view of the main part of the semiconductor device in a manufacturing process.

Next, a method for manufacturing the semiconductor device 1 will be described. First, as shown in FIG. 3, the nitride semiconductor layer 20 is prepared using an epitaxial growth technique. In the preparation of the nitride semiconductor layer 20, the n-type GaN drift region 22 and the p-type GaN body region 24 are layered in this order on the surface of the drain region 21, which is a GaN substrate. Note that, in FIG. 3, planned formation ranges where the first groove TR1, the second groove TR2 and the source region 25 are to be formed in the nitride semiconductor layer 20 are indicated by broken lines.

Figure 4:
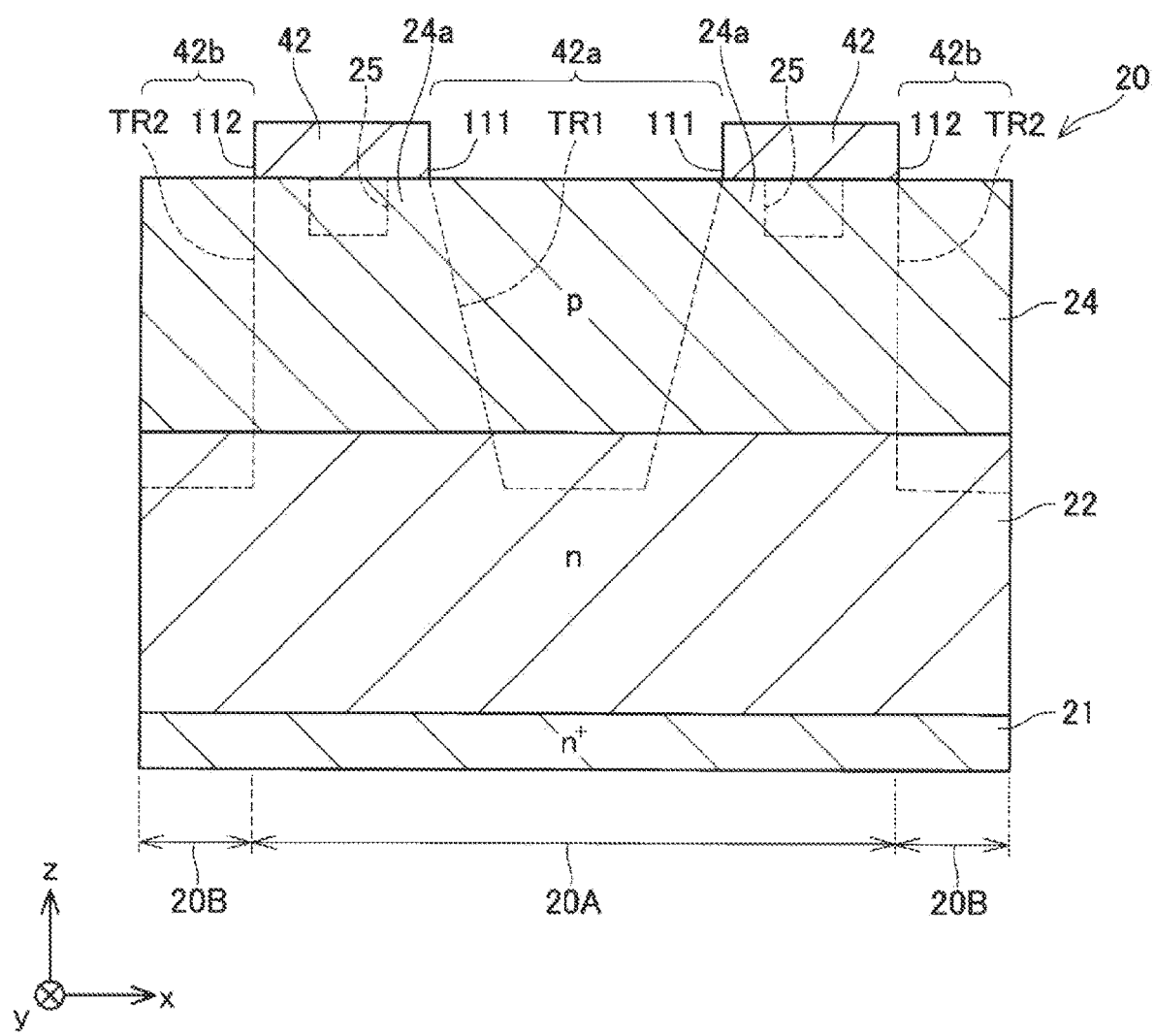
FIG. 4 is a diagram schematically showing a cross-sectional view of the main part of the semiconductor device in a manufacturing process.

Next, as shown in FIG. 4, a mask 42 is patterned on the front surface of the nitride semiconductor layer 20 by using a photolithography technique. The mask 42 is formed with an opening 42a at a position corresponding to the first groove TR1 and an opening 42b at a position corresponding to the second groove TR2. A side surface 111 defining the opening 42a of the mask 42 adjacent to the channel portion 24a is parallel to the m-plane of the nitride semiconductor layer 20. Further, a side surface 112 defining the opening 42b of the mask 42 is parallel to the a-plane of the nitride semiconductor layer 20.

Figure 5:
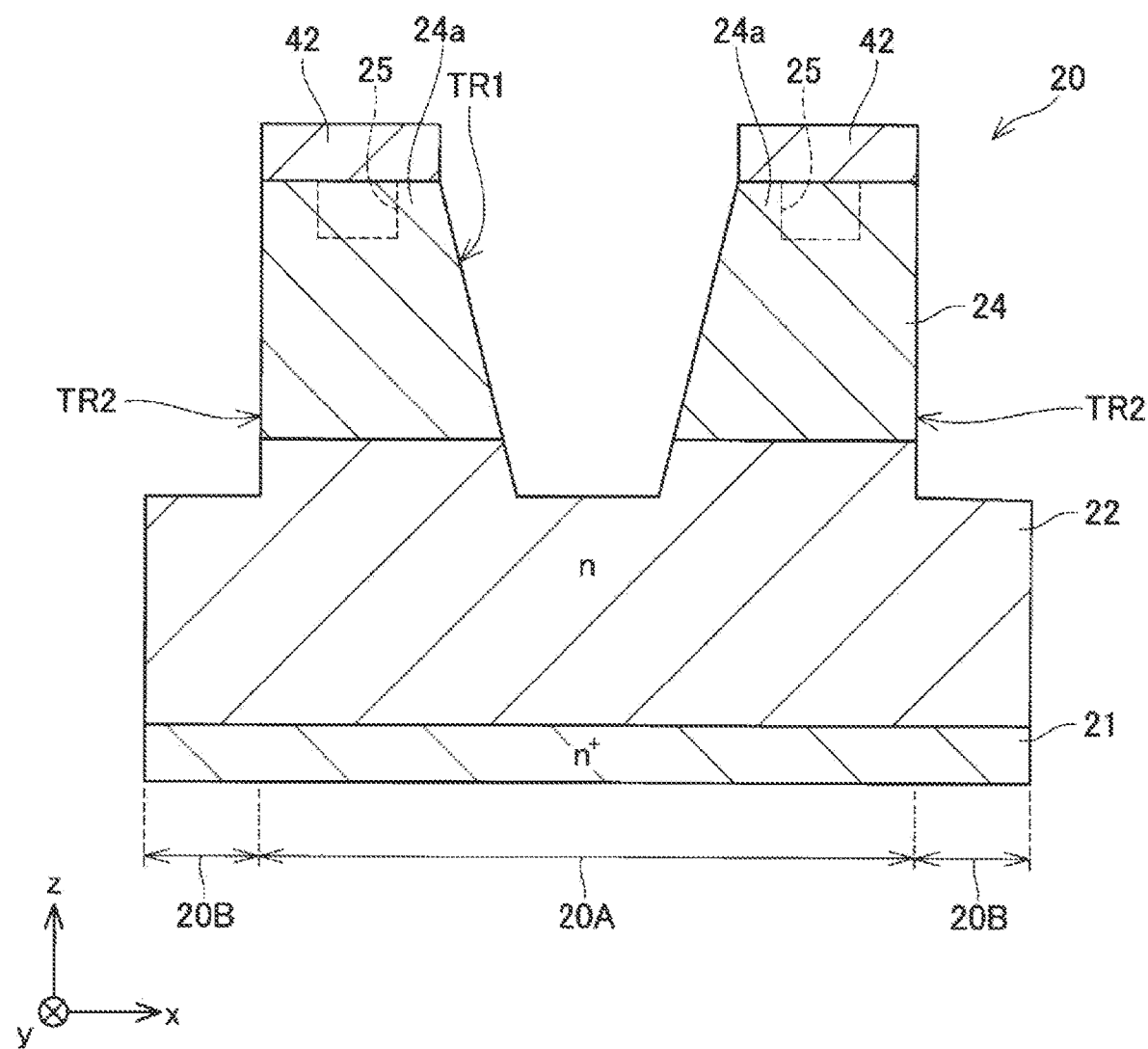
FIG. 5 is a diagram schematically showing a cross-sectional view of the main part of the semiconductor device in a manufacturing process.

Next, as shown in FIG. 5, using a dry etching technique, the first groove TR1 and the second groove TR2 are formed at the same time so as to penetrate through the body region 24 from the front surface of the nitride semiconductor layer 20 and reach the drift region 22. In this dry etching step, the first groove TR1 and the second groove TR2 are formed so that the side surface of the first groove TR1 and the side surface of the second groove TR2 have different inclination angles. The reason why the inclination angles of the side surfaces are formed so as to be different will be described below.

The dry etching step is carried out using an inductively coupled plasma reactive ion etching apparatus (ICP-RIE apparatus). For example, the dry etching step is carried out under conditions that the pressure is 1.0 Pa, the etching gas is $SiCl_4$ and $Cl_2$, and the stage temperature is 180 degrees Celsius (° C.). Here, the ICP-RIE apparatus is capable of independently controlling two electric powers, an antenna power for forming plasma and a bias power for forming a potential difference between the plasma and the nitride semiconductor layer 20. An increase in the antenna power tends to increase the effect of isotropic etching. An increase in the bias power tends to increase the effect of anisotropic etching. Further, the magnitude of the tendency of these isotropic etching and anisotropic etching depends on the plane orientation of the crystal plane of the nitride semiconductor layer 20. Therefore, in this dry etching step, the inclination angles of the side surfaces of the first and second grooves TR1 and TR2 can be adjusted by controlling the combination of the power ratio of the antenna power to the bias power (antenna power/bias power) and the plane orientation of the crystal plane.

In this dry etching step, the side surface of the first groove TR1 is set to the m-plane, the side surface of the second groove TR2 is set to the a-plane, and the power ratio of the antenna power to the bias power (antenna power/bias power) is controlled in the range of 4.3 to 6.9. As a result, it was confirmed that the side surface of the first groove TR1 is processed to be inclined, and the side surface of the second groove TR2 is processed substantially vertically, so that the relation in which the inclination angle of the side surface of the first groove TR1 is smaller than the inclination angle of the side surface of the second groove TR2 is satisfied.

Figure 6:
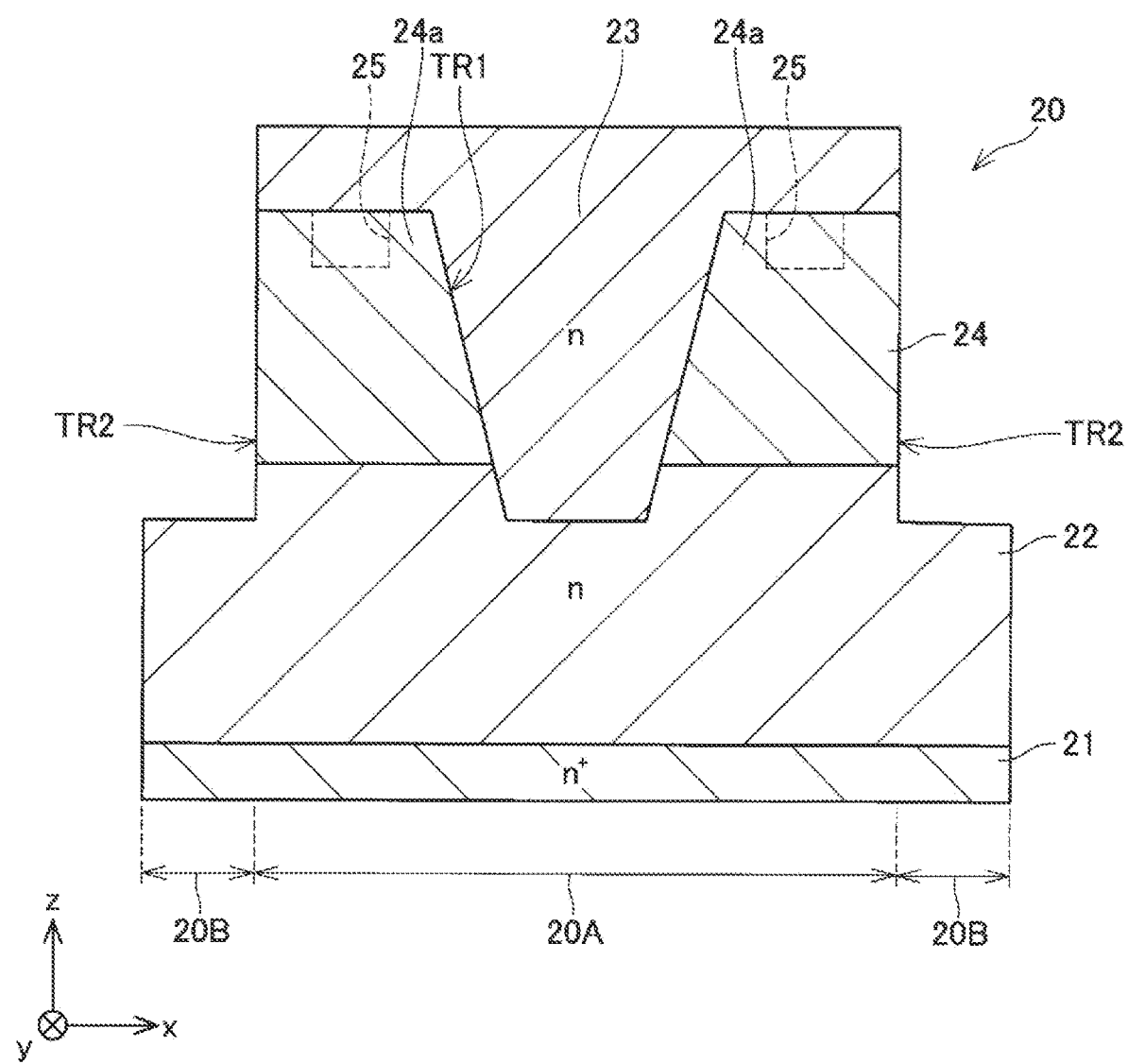
FIG. 6 is a diagram schematically showing a cross-sectional view of the main part of the semiconductor device in a manufacturing process.

Next, as shown in FIG. 6, the n-type GaN is epitaxially grown again by utilizing the epitaxial growth technique so as to form the JFET region 23 in the first groove TR1. The first groove TR1 has the tapered shape that narrows in the depth direction of the nitride semiconductor layer 20. Therefore, the JFET region 23 can be satisfactorily embedded in the first groove TR1 without forming a cavity or the like.

Figure 7:
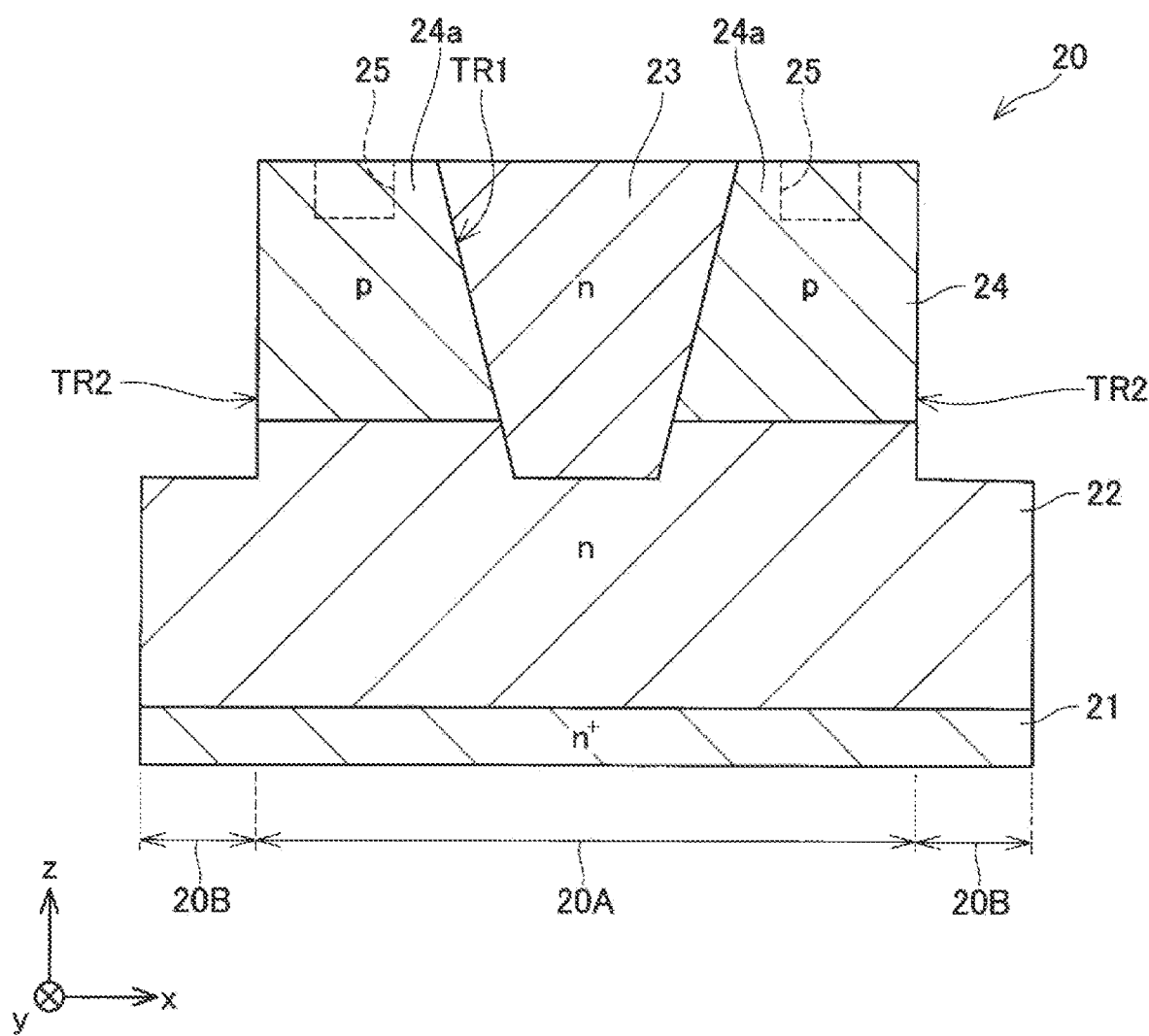
FIG. 7 is a diagram schematically showing a cross-sectional view of the main part of the semiconductor device in a manufacturing process.

Next, as shown in FIG. 7, the JFET region 23 formed above the surface of the body region 24 is removed by utilizing a chemical mechanical polishing (CMP) technique so as to expose the surface of the body region 24.

Figure 8:
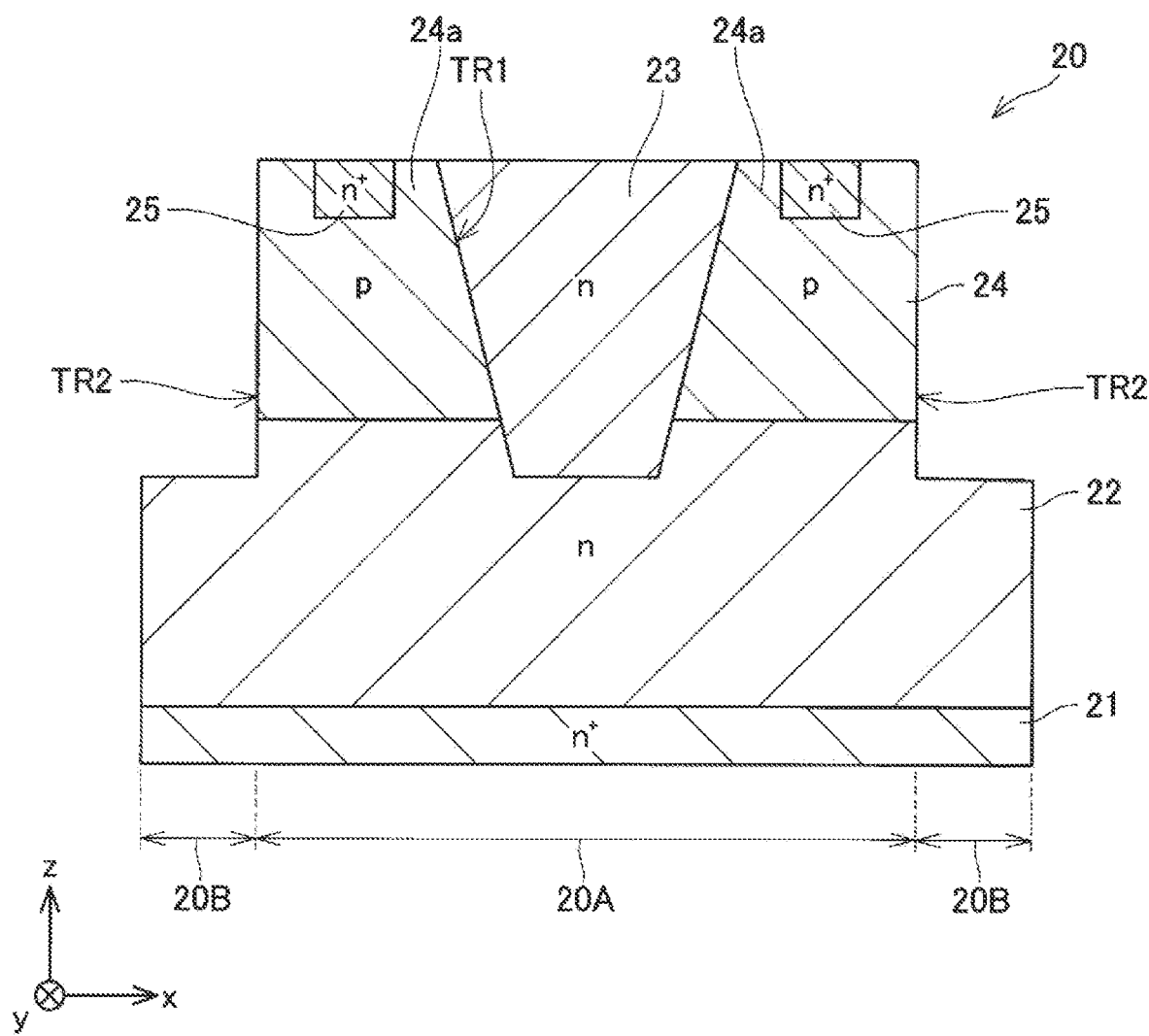
FIG. 8 is a diagram schematically showing a cross-sectional view of the main part of the semiconductor device in a manufacturing process.

Next, as shown in FIG. 8, an n-type impurity is introduced into a part of the surface of the body region 24 by utilizing an ion implantation technique so as to form the source region 25.

Figure 9:
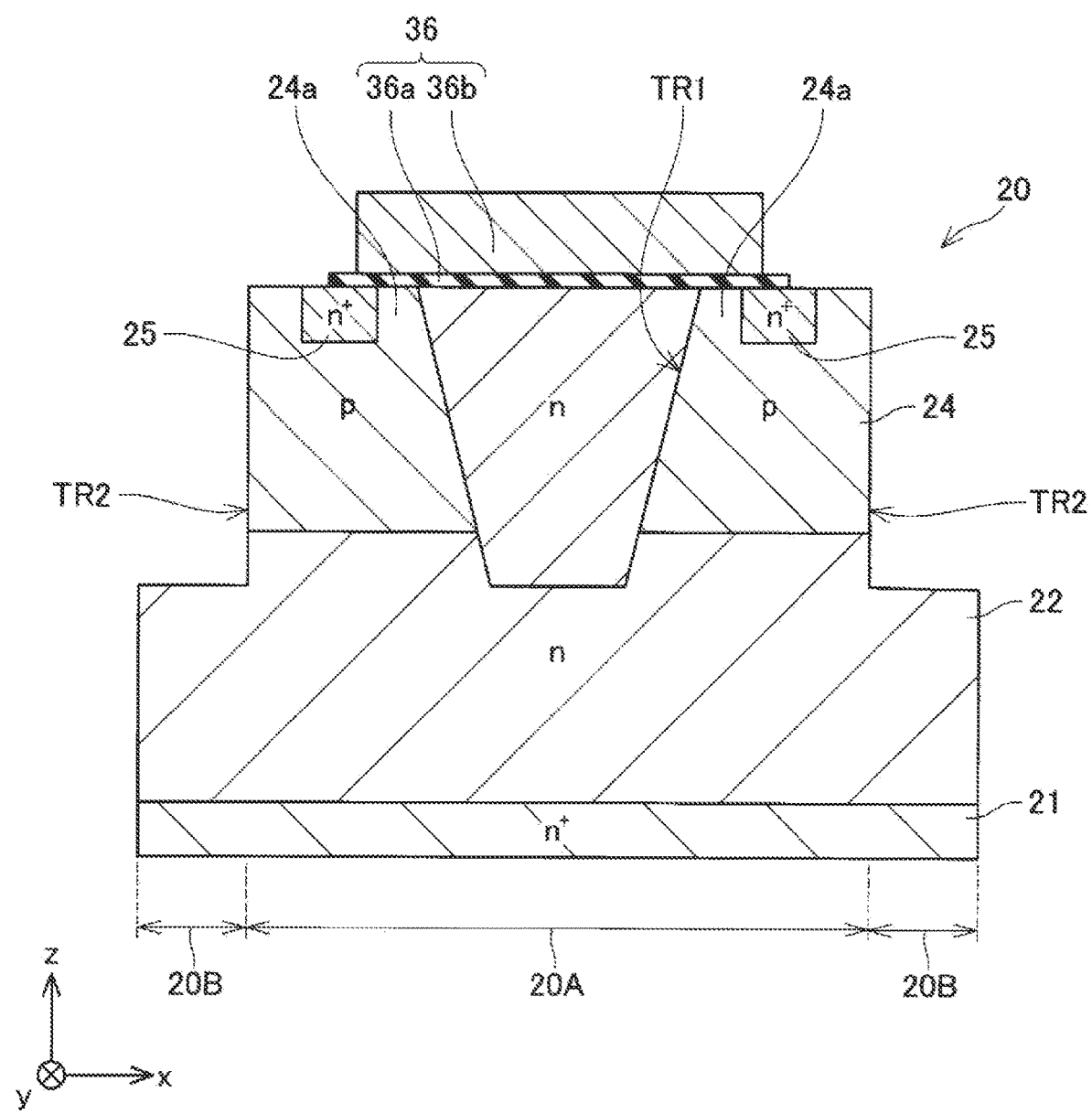
FIG. 9 is a diagram schematically showing a cross-sectional view of the main part of the semiconductor device in a manufacturing process.

Next, as shown in FIG. 9, the gate insulating film 36a and the gate electrode 36b are formed on a part of the surface of the nitride semiconductor layer 20, thereby to form the insulating gate portion 36. Thereafter, the drain electrode 32 and the source electrode 34 are film-formed. In this way, the semiconductor device 1 can be produced.

According to the manufacturing method described above, the first groove TR1 for embedding the JFET region 23 and the second groove TR2 of the peripheral withstand voltage part 20B are formed at the same time. Further, the plane orientation of the crystal plane adopted for forming the first groove TR1 is the m-plane, and the plane orientation of the crystal plane adopted for forming the second groove TR2 is the a-plane. Namely, the plane orientation is different between the first groove TR1 and the second groove TR2. For this reason, even if the first groove TR1 and the second groove TR2 are formed at the same time, the inclination angle of the side surface of the first groove TR1 and the inclination angle of the side surface of the second groove TR2 can be made different from each other. As such, the inclination angle of the side surface of the first groove TR1 and the inclination angle of the side surface of the second groove TR2 can be adjusted according to characteristics required for the semiconductor device 1 with a small number of steps.

Figure 10:
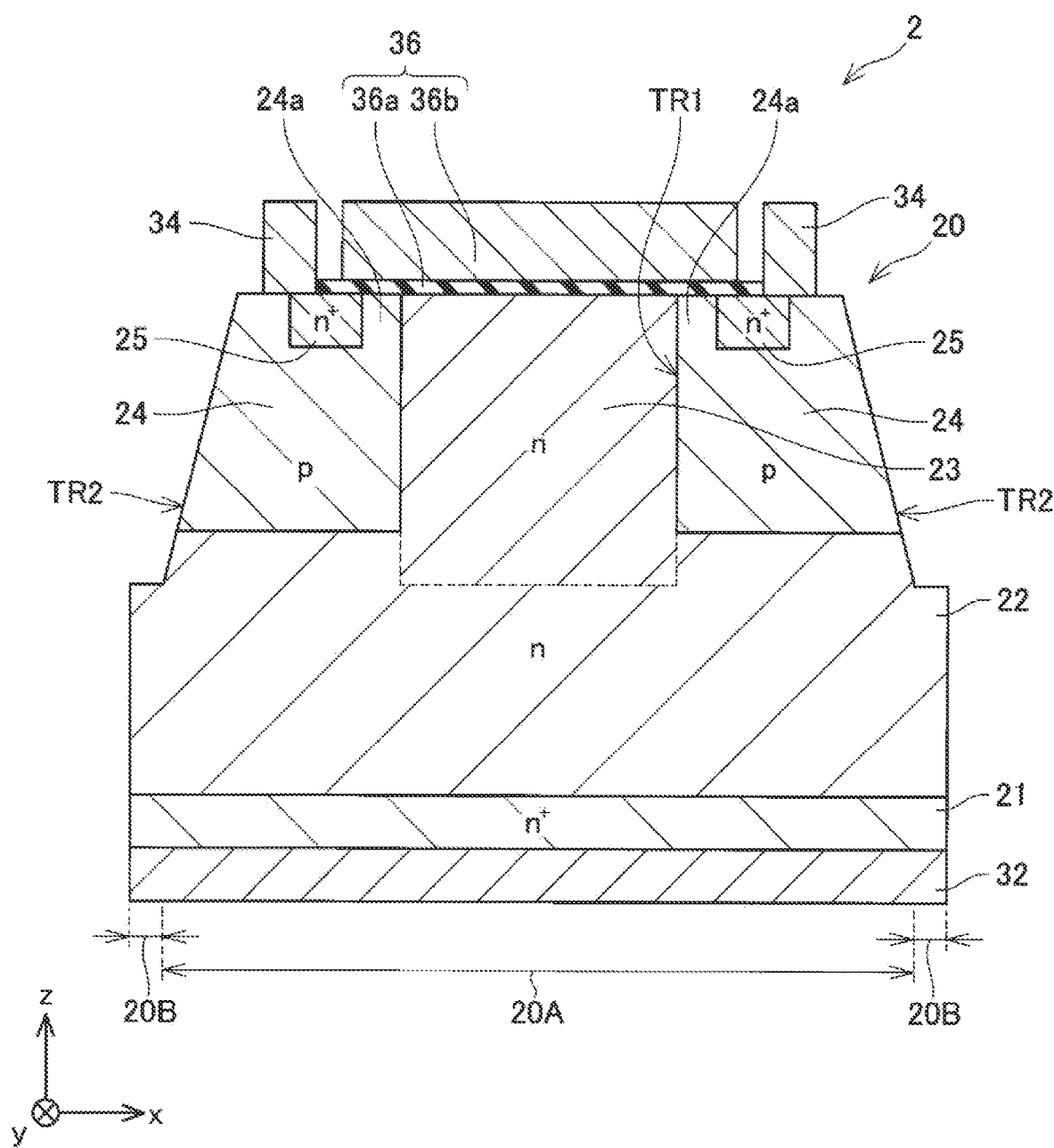
FIG. 10 is a diagram schematically showing a cross-sectional view of a main part of a semiconductor device according to a modification.

Assuming that the plane orientation of the crystal plane adopted for forming the first groove TR1 is the a-plane and the plane orientation of the crystal plane adopted for forming the second groove TR2 is the m-plane, a semiconductor device 2 shown in FIG. 10 can be manufactured. In the semiconductor device 2 shown in FIG. 10, since the inclination angle of the side surface of the first groove TR1 adjacent to the channel portion 24a is large, the electric field concentration in the JFET region 23 is relaxed. On the other hand, since the inclination angle of the side surface of the second groove TR2 is small, a field plate electrode or the like can be satisfactorily formed on the side surface of the second groove TR2.

The technical features described in the present disclosure will be summarized below. It should be noted that the technical elements described below are independent technical elements and exhibit technical usefulness alone or in various combinations, and are not limited to the combinations described in the present description at the time of filing.

In an embodiment, a semiconductor device includes a nitride semiconductor layer, a source electrode, a drain electrode, and an insulating gate portion. The nitride semiconductor layer is sectioned into an element part and a peripheral withstand voltage part on a periphery pf the element part. The source electrode is disposed so as to cover a first main surface of the nitride semiconductor layer. The drain electrode is disposed so as to cover a second main surface of the nitride semiconductor layer, opposite to the first main surface. The nitride semiconductor layer includes a first conductivity type drift region, a first conductivity type JFET region, a second conductivity type body region, and a first conductivity type source region. The drift region is provided in the element part and the peripheral withstand voltage part. The JFET region is provided in the element part. The JFET region is arranged on the drift region, and is embedded in a first groove formed on the first main surface of the nitride semiconductor layer. The body region is provided in the element part. The body region is arranged on the drift region, and is adjacent to the JFET region. The source region is provided in the element part. The source region is separated from the JFET region by the body region. The insulating gate portion is provided in the element part. The insulating gate portion faces a channel portion of the body region that separates the JFET region and the source region. A second groove is provided on the first main surface of the nitride semiconductor layer in the peripheral withstand voltage part of the nitride semiconductor layer. An inclination angle of the side surface of the first groove adjacent to the channel portion is smaller than an inclination angle of the side surface of the second groove.

In such a semiconductor device, the inclination angle of the side surface of the second groove may be approximately 90°. In such a case, the electric field concentration in the vicinity of the p-n junction surface between the drift region and the body region is satisfactorily alleviated, and the breakdown voltage is improved.

In an embodiment, the contour of the side surface of the first groove adjacent to the channel portion and exposed on the first main surface of the nitride semiconductor layer may be parallel to an m-plane. Further, the contour of the side surface of the second groove exposed on the first main surface of the nitride semiconductor layer may be parallel to an a-plane. In such a case, when the first groove and the second groove are formed at the same time, the inclination angle of the side surface of the first groove can be made small, and the inclination angle of the side surface of the second groove can be made large.

In an embodiment, the p-n junction surface between the drift region and the body region may be exposed on the side surface of the second groove. In such a case, the electric field concentration in the vicinity of the p-n junction surface between the drift region and the body region is satisfactorily alleviated, and the breakdown voltage is improved.

In an embodiment, a method for manufacturing a semiconductor device includes a step of preparing a nitride semiconductor layer, a step of forming a groove, a step of forming a JFET region, a step of forming a source region, and a step of forming insulating gate portion. In the step of preparing the nitride semiconductor layer, the nitride semiconductor layer in which a first conductivity type drift region and a second conductivity type body region are layered and the body region is exposed on a first main surface of the nitride semiconductor layer is prepared. In the step of forming the groove, the groove is formed to extend from the first main surface of the nitride semiconductor layer and to reach the drift region through the body region by utilizing a dry etching technique. In the step of forming the groove, as the groove, a first groove and a second groove are formed at the same time. The first groove is formed in a part of an element part of the nitride semiconductor layer and the second groove is formed in a peripheral withstand voltage part of the nitride semiconductor layer. In the step of forming the JFET region, a first conductivity type JFET region is formed so as to be embedded in the first groove. In the step of forming the source region, a first conductivity type source region is formed to be separated from the JFET region by the body region. In the step of forming the insulating gate portion, an insulating gate portion is formed so as to face a channel portion of the body region that separates the JFET region and the source region. In the step of forming the groove, the first groove and the second groove may be formed at the same time, so that the contour of the side surface of the first groove adjacent to the channel portion and exposed on the first main surface of the nitride semiconductor layer is parallel to the m-plane, and the contour of the side surface of the second groove exposed on the first main surface of the nitride semiconductor layer is parallel to the a-plane. Alternatively, in the step of forming the groove, the first groove and the second groove may be formed at the same time, so that the contour of the side surface of the first groove adjacent to the channel portion and exposed on the first main surface of the nitride semiconductor layer is parallel to the a-plane, and the contour of the side surface of the second groove exposed on the first main surface of the nitride semiconductor layer is parallel to the m-plane.

In an embodiment, in the step of forming the groove, the first groove and the second groove are formed at the same time, so that the contour of the side surface of the first groove adjacent to the channel portion and exposed on the first main surface of the nitride semiconductor layer is parallel to the m-plane, and the contour of the side surface of the second groove exposed on the first main surface of the nitride semiconductor layer is parallel to the a-plane. In such a method, the inclination angle of the side surface of the first groove can be made small, and the inclination angle of the side surface of the second groove can be made large.

In an embodiment, in the step of forming the groove, the power ratio of antenna power to bias power may be 4.3 or more and 6.9 or less. In such a method, the inclination angle of the side surface of the first groove can be made small, and the inclination angle of the side surface of the second groove can be made large.

Although specific examples of the present disclosure have been described in detail above, these are merely examples and do not limit the scope of claims. The techniques described in the claims include various modifications and modifications of the specific examples illustrated above. In addition, the technical elements described in the present specification or the drawings exhibit technical usefulness alone or in various combinations, and are not limited to the combinations described in the present description at the time of filing. In addition, the techniques illustrated in the present specification or drawings can achieve multiple purposes at the same time, and achieving one of the purposes itself has technical usefulness.

What is claimed is:

1. A semiconductor device comprising:
a nitride semiconductor layer sectioned into an element part and a peripheral withstand voltage part on a periphery of the element part, the nitride semiconductor layer having a first main surface and a second main surface opposite to the first main surface;
a source electrode disposed on the first main surface of the nitride semiconductor layer;
a drain electrode disposed on the second main surface of the nitride semiconductor layer; and
an insulating gate portion,
wherein the nitride semiconductor layer includes:
- a first conductivity type drift region provided in the element part and the peripheral withstand voltage part;
- a first conductivity type JFET region provided in the element part, the JFET region arranged on the drift region and embedded in a first groove provided on the first main surface of the nitride semiconductor layer;
- a second conductivity type body region provided in the element part, the body region arranged on the drift region and adjacent to the JFET region; and
- a first conductivity type source region provided in the element part, the source region separated from the JFET region by the body region,
wherein the insulating gate portion is provided in the element part and disposed to face a channel portion of the body region that separates the JFET region and the source region,
wherein the nitride semiconductor layer is formed with a second groove on the first main surface in the peripheral withstand voltage part,
wherein an inclination angle of a side surface of the first groove adjacent to the channel portion is smaller than an inclination angle of a side surface of the second groove,
wherein the side surface of the first groove adjacent to the channel portion has a contour exposed on the first main surface of the nitride semiconductor layer, and the contour of the side surface of the first groove is parallel to a m-plane, and
wherein the side surface of the second groove has a contour exposed on the first main surface of the nitride semiconductor layer, and the contour of the side surface of the second groove is parallel to an a-plane.

2. The semiconductor device according to claim 1, wherein the inclination angle of the side surface of the second groove is approximately 90 degrees.

3. The semiconductor device according to claim 1, wherein a p-n junction surface between the drift region and the body region is exposed on the side surface of the second groove.

* * * * *